(12) United States Patent
Chen et al.

(10) Patent No.: US 8,772,929 B2
(45) Date of Patent: Jul. 8, 2014

(54) PACKAGE FOR THREE DIMENSIONAL INTEGRATED CIRCUIT

(75) Inventors: Chih-Hao Chen, Hsin-Chu (TW); Long Hua Lee, Taipei (TW); Chun-Hsing Su, New Taipei (TW); Yi-Lin Tsai, Tainan (TW); Kung-Chen Yeh, Taichung (TW); Chung Yu Wang, Hsin-Chu (TW); Jui-Pin Hung, Hsinchu (TW); Jing-Cheng Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/297,992

(22) Filed: Nov. 16, 2011

(65) Prior Publication Data

US 2013/0119533 A1    May 16, 2013

(51) Int. Cl.
*H01L 23/48* (2006.01)
*H01L 21/78* (2006.01)

(52) U.S. Cl.
USPC ............ 257/737; 257/E23.021; 257/E21.499; 257/E21.599; 257/738; 257/778; 257/773; 257/774; 257/775; 257/776; 257/777; 257/723; 257/686; 257/685

(58) Field of Classification Search
USPC ......... 257/774, 775, 777, 776, 723, 686, 685, 257/E21.499, E23.021, E21.599, 737, 738, 257/778, 773; 438/113
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |

(Continued)

*Primary Examiner* — Alexander Oscar Williams
(74) *Attorney, Agent, or Firm* — Slater and Matsil, L.L.P.

(57) ABSTRACT

A wafer level package includes a semiconductor die bonded on a supporting wafer. The semiconductor die has at least a step recess at its substrate. An underfill layer is formed between the semiconductor die and the supporting wafer. Moreover, the height of the underfill layer is limited by the step recess. During a fabrication process of the wafer level package, the step recess helps to reduce the stress on the wafer level package.

14 Claims, 12 Drawing Sheets

(56) References Cited

U.S. PATENT DOCUMENTS

| | | |
|---|---|---|
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,482,702 B2 * | 1/2009 | Farnworth et al. ............ 257/790 |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,667,335 B2 * | 2/2010 | Lin et al. ....................... 257/779 |
| 7,727,858 B2 * | 6/2010 | Kinsman et al. .............. 438/455 |
| 7,834,450 B2 | 11/2010 | Kang |
| 8,338,941 B2 * | 12/2012 | Lee et al. ....................... 257/698 |
| 8,399,987 B2 * | 3/2013 | Kwon et al. ................... 257/730 |
| 2007/0132089 A1 * | 6/2007 | Jiang et al. .................... 257/700 |
| 2007/0148918 A1 * | 6/2007 | Kinsman et al. .............. 438/460 |
| 2009/0065902 A1 * | 3/2009 | Yu et al. ........................ 257/620 |
| 2009/0072332 A1 * | 3/2009 | Dekker et al. ................ 257/414 |
| 2009/0079041 A1 * | 3/2009 | Huang et al. .................. 257/660 |
| 2009/0189279 A1 * | 7/2009 | How .............................. 257/737 |
| 2012/0049358 A1 * | 3/2012 | Cheng .......................... 257/738 |
| 2012/0146177 A1 * | 6/2012 | Choi et al. .................... 257/528 |
| 2012/0279287 A1 * | 11/2012 | Andry et al. ................... 73/105 |
| 2012/0286701 A1 * | 11/2012 | Yang et al. .................... 315/312 |
| 2013/0026609 A1 * | 1/2013 | Wu et al. ....................... 257/632 |
| 2013/0149215 A1 * | 6/2013 | Dekker et al. ................ 422/502 |

\* cited by examiner

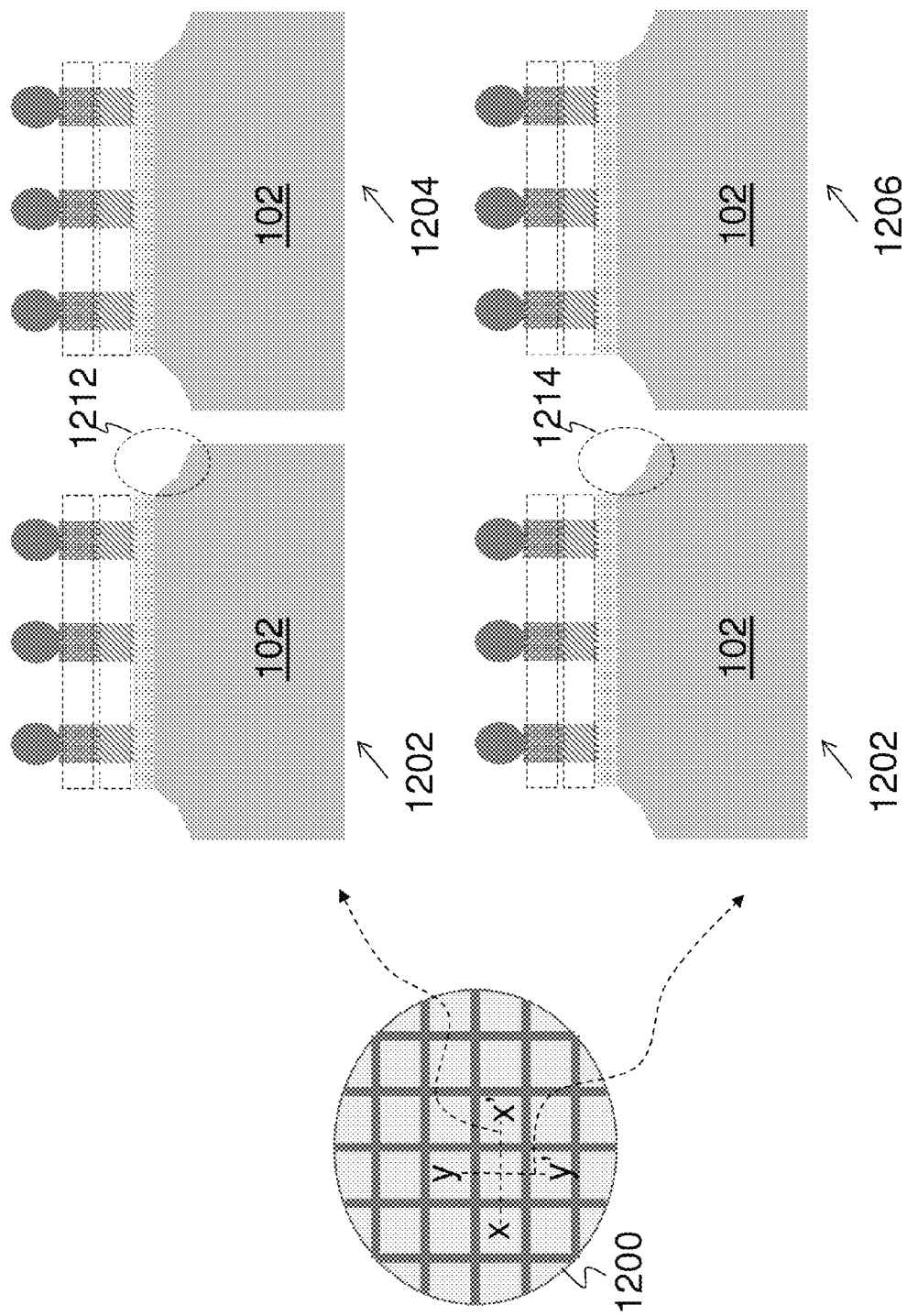

PACKAGE FOR THREE DIMENSIONAL INTEGRATED CIRCUIT

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies evolve, multi-chip wafer level package based semiconductor devices have emerged as an effective alternative to further reduce the physical size of a semiconductor chip. In a wafer level package based semiconductor device, active circuits such as logic, memory, processor circuits and the like are fabricated on different wafers and each wafer die is stacked on top of another wafer die using pick-and-place techniques. Much higher density can be achieved by employing multi-chip semiconductor devices. Furthermore, multi-chip semiconductor devices can achieve smaller form factors, cost-effectiveness, increased performance and lower power consumption.

A three-dimensional (3D) integrated circuit (IC) may comprise a top active circuit layer, a bottom active circuit layer and a plurality of inter-layers. In a 3D IC, two dies may be bonded together through a plurality of bumps and electrically coupled to each other through a plurality of through vias. The bumps and through vias provide an electrical interconnection in the vertical axis of the 3D IC. As a result, the signal paths between two semiconductor dies are shorter than those in a traditional 3D IC in which different dies are bonded together using interconnection technologies such as wire bonding based chip stacking packages. A 3D IC may comprise a variety of semiconductor dies stacked together. The multiple semiconductor dies are packaged before the wafer has been diced. The wafer level package technology has some advantages. One advantageous feature of packaging multiple semiconductor dies at the wafer level is multi-chip wafer level package techniques may reduce fabrication costs. Another advantageous feature of wafer level package based multi-chip semiconductor devices is that parasitic losses are reduced by employing bumps and through vias.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 12 illustrates cross sectional views of a wafer after a two-step dicing process in accordance with yet another embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a wafer level package for three-dimensional (3D) integrated circuits (IC). The disclosure may also be applied, however, to a variety of integrated circuits.

Figure 1:
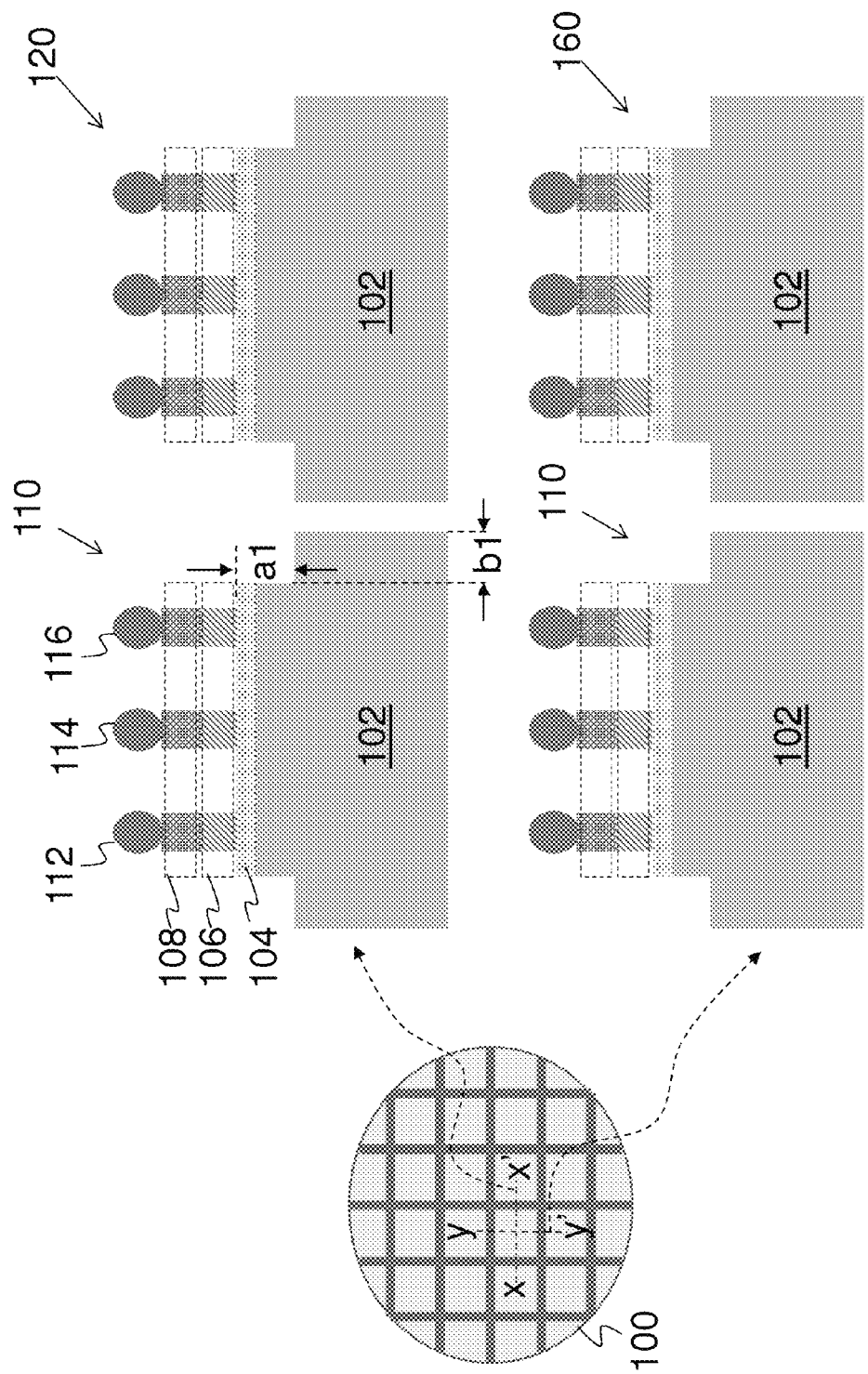
FIG. 1 illustrates cross sectional views of a wafer after a dicing process in accordance with an embodiment.

Referring initially to FIG. 1, cross sectional views of a wafer after a dicing process are illustrated in accordance with an embodiment. As shown in FIG. 1, the wafer 100 may comprise a plurality of integrated circuits. After a dicing process, semiconductor dies (e.g., semiconductor die 110) are separated from the wafer 100. A first cross sectional view is taken along the dashed line x-x'. The first cross section view includes a first semiconductor die 110 and a second semiconductor die 120. Likewise, a second cross sectional view is taken along the dashed line y-y'. The second cross section view includes the first semiconductor die 110 and a third semiconductor die 160.

In accordance with an embodiment, the three semiconductor dies 110, 120 and 160 shown in FIG. 1 have a substantially identical structure. For simplicity, only the structure of the first semiconductor die 110 is described in detail below. It should be noted that in order to give a basic insight of the inventive aspects of various embodiments, the first semiconductor die 110, the second semiconductor die 120 and the third semiconductor die 160 are drawn without details. However, it should be noted that the first semiconductor die 110, the second semiconductor die 120 and the third semiconductor die 160 may comprise basic semiconductor layers such as active circuit layers, substrate layers, inter-layer dielectric (ILD) layers and inter-metal dielectric (IMD) layers (not shown).

As shown in FIG. 1, the first semiconductor die 110 comprises a substrate 102. The substrate 102 may be a silicon substrate. Alternatively, the substrate 102 may be a silicon-on-insulator substrate. The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present invention in any manner.

An isolation layer 104 is formed on top of the substrate 102. The isolation layer 104 may be formed, for example, of a low-K dielectric material, such as silicon oxide. The isolation layer 104 may be formed by any suitable method known in the art, such as spinning, chemical vapor deposition (CVD) and plasma enhanced chemical vapor deposition (PECVD). It should also be noted that one skilled in the art will recognize that the isolation layer 104 may further comprise a plurality of dielectric layers.

A redistribution layer (RDL) 106 is formed on top of the isolation layer 104. The active circuit layer (not shown) of the first semiconductor die 110 may be bridged by the RDL layer 106 so that the active circuit layer of the first semiconductor die 110 can be coupled to the input and output (I/O) terminals of the semiconductor die 110. A plurality of under bump metal (UBM) structures 108 are formed on top of the RDL layer 106. Interconnection bumps 112, 114 and 116 are formed on top of the UBM structures 108. The UBM structures 108 may help to prevent diffusion between the interconnection bumps (e.g., interconnection bump 112) and the integrated circuits of the first semiconductor die 110, while providing a low resistance electrical connection. The interconnection bumps (e.g., interconnection bump 112) provide an effective way to connect the first semiconductor die 110 with external circuits (not shown). The interconnection bumps are I/O terminals of the first semiconductor die 110. In accordance with an embodiment, the interconnection bumps (e.g., interconnection bump 112) may be a plurality of solder balls. Alternatively, the interconnection bumps may be a plurality of land grid array (LGA) pads.

FIG. 1 further illustrates there may be four step recesses at each semiconductor die's substrate. For example, the first semiconductor die 110 may include four step recesses on all four sides of the body of the first semiconductor die 110. More particularly, two step recesses of the first semiconductor die 110 are illustrated in the first cross sectional view taken along the dashed line x-x'. Likewise, the other two step recesses of the first semiconductor die 110 are illustrated in the second cross sectional view taken along the dashed line y-y'. In accordance with an embodiment, the step recess has a vertical recess depth a1 ranging from about 20 um to about 300 um. The step recess length b1 is in a range from about 20 um to about 200 um. The detailed fabrication procedures for generating the step recesses will be described in detail with respect to FIG. 2.

Figure 2:
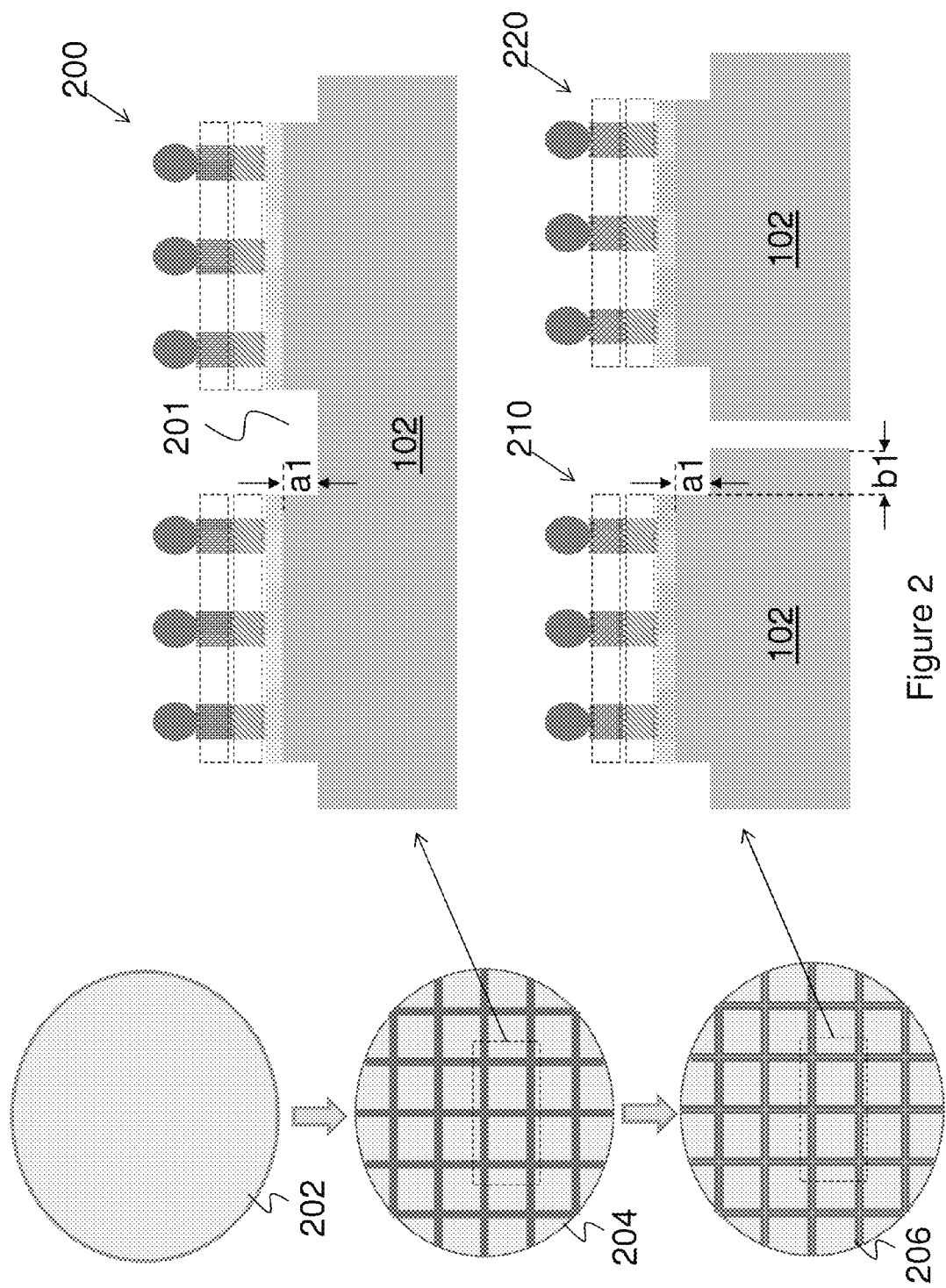
FIG. 2 illustrates fabrication procedures for generating the step recesses in accordance with an embodiment.

FIG. 2 illustrates fabrication procedures for generating the step recesses in accordance with an embodiment. During a two-step dicing process, a wafer 202 is cut based upon the dicing pattern of the wafer 202. A first dicing saw (not shown) cuts through the thickness of the isolation layer 104 and about 100 um into the substrate 102. The blade of the first dicing saw (not shown) has a thickness ranging from about 40 um to about 400 um. As a result, a trench 201 is formed in the substrate 102. A wafer 204 illustrates there may be a plurality of integrated circuits embedded in the wafer 204, each of which is enclosed by trenches (e.g., trench 201). Furthermore, a second dicing saw with a thin blade (not shown) is employed to cut through the thickness of the substrate 102. As a result, the semiconductor dies (e.g., semiconductor die 210) are separated from the wafer 206.

Such a two-step dicing process leads to a semiconductor die (e.g., semiconductor die 210) with four step recesses at four sides of the body of the semiconductor die. It should be noted that the dimensions used in the previous example are selected purely for demonstration purposes and are not intended to limit the various embodiments to any particular size dimensions. One of ordinary skill in the art would recognize many variations, alternatives, and modifications. For example, by controlling the dicing depth of the first dicing step or employing a dicing saw with a different blade width, the trench dimension as well as the size of the step recess can be adjusted accordingly. It should be noted that in the example described above while two dicing saws are employed to generate the step recesses, one skilled in the art will recognize that the step recesses can be created by using other dicing tools such as laser dicing tools. The operation principles of laser dicing tools are well known in the art, and hence are not discussed in detail herein.

Figure 3:
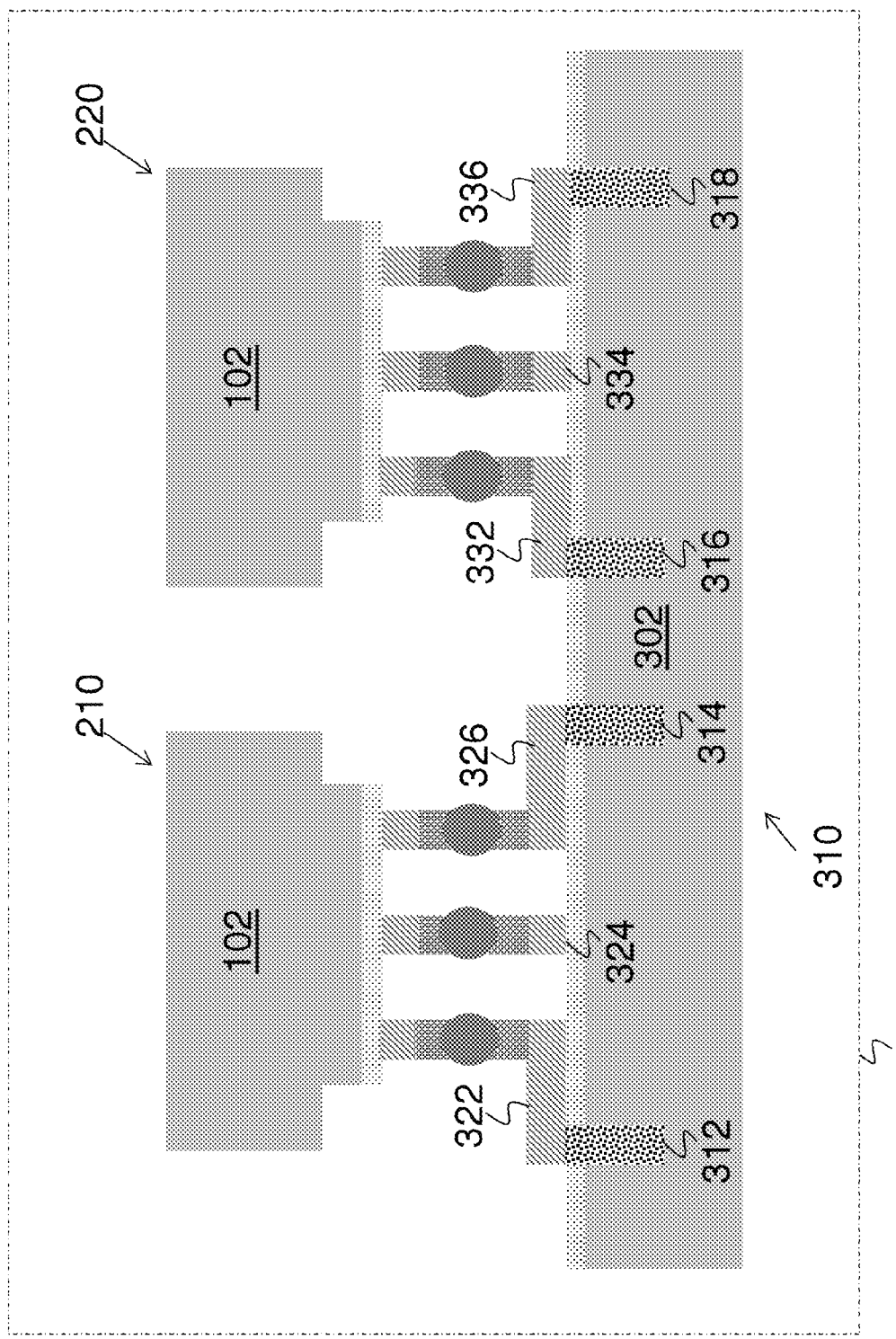
FIG. 3 illustrates a process of stacking a plurality of semiconductor dies on a supporting wafer.

FIGS. 3-7 are cross sectional views of intermediate stages in the making of a 3D IC in accordance with an embodiment. FIG. 3 illustrates a process of stacking a plurality of semiconductor dies on a supporting wafer. After the two-step dicing process shown in FIG. 2, the semiconductor dies 210 and 220 are flipped and further bonded on a supporting wafer 310 through a reflow process. The supporting wafer 310 may be alternatively referred to as a package substrate. The package substrate may be made of ceramic materials, organic materials and/or the like. As shown in FIG. 3, the supporting wafer 310 may comprise a plurality of vias embedded in the substrate of the supporting wafer 310. After the semiconductor dies 210 and 220 are bonded on the supporting wafer 310, the active circuits of the semiconductor dies (e.g., semiconductor die 210) are coupled to the vias of the supporting wafer 310 through a conductive channel formed by the RDL layers on the supporting wafer (e.g., RDL layer 322), the interconnection bumps connected between the supporting wafer 310 and the semiconductor dies (e.g., semiconductor die 210).

Figure 4:
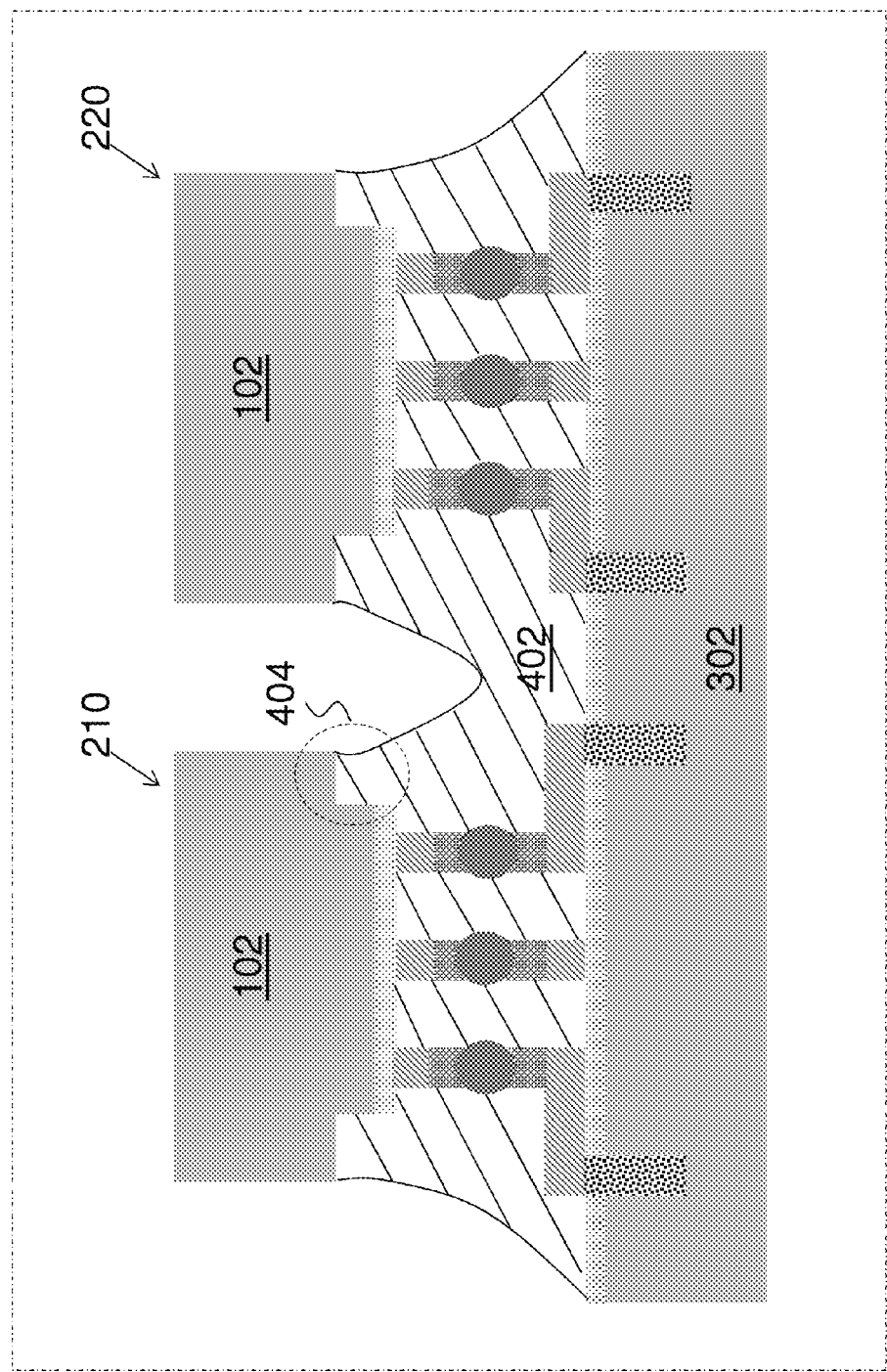
FIG. 4 illustrates a cross sectional view of a three dimensional (3D) integrated circuit (IC) having an underfill material layer formed between the semiconductor dies and the supporting wafer.

FIG. 4 illustrates a cross sectional view of a 3D IC having an underfill material layer formed between the semiconductor dies and the supporting wafer. An underfill material 402 may be formed in the gap between the supporting wafer 302 and the plurality of semiconductor dies (e.g., the first semiconductor die 102) mounted on top of the wafer 302. In accordance with an embodiment, the underfill material 402 may be an epoxy, which is dispensed at the gap between the supporting wafer 302 and the first semiconductor die 102. The epoxy may be applied in a liquid form, and may harden after a curing process.

As shown in FIG. 4, the height of the underfill material layer 402 is controlled by the step recesses (e.g., step recess 404). In other words, such a step recess creates a ceiling for the underfill material layer 402. As shown in FIG. 4, a top non-recess portion of the first semiconductor die 210, a recess of the first semiconductor die 210, a top non-recess portion of the second semiconductor die 220, a recess of the second semiconductor die 220 are embedded in the underfill material layer 402. In accordance with another embodiment, the underfill layer 402 may be formed of curable materials such as polymer based materials, resin based materials, polyimide, epoxy and any combinations of thereof. The underfill layer 402 can be formed by a spin-on coating process, dry film lamination process and/or the like. An advantageous feature of having an underfill material (e.g., underfill material 402) is that the underfill material 402 helps to prevent the wafer stack 400 from cracking. In addition, another advantage feature is that the underfill material 402 may help to reduce the mechanical and thermal stresses during the fabrication process of the wafer stack 400.

Figure 5:
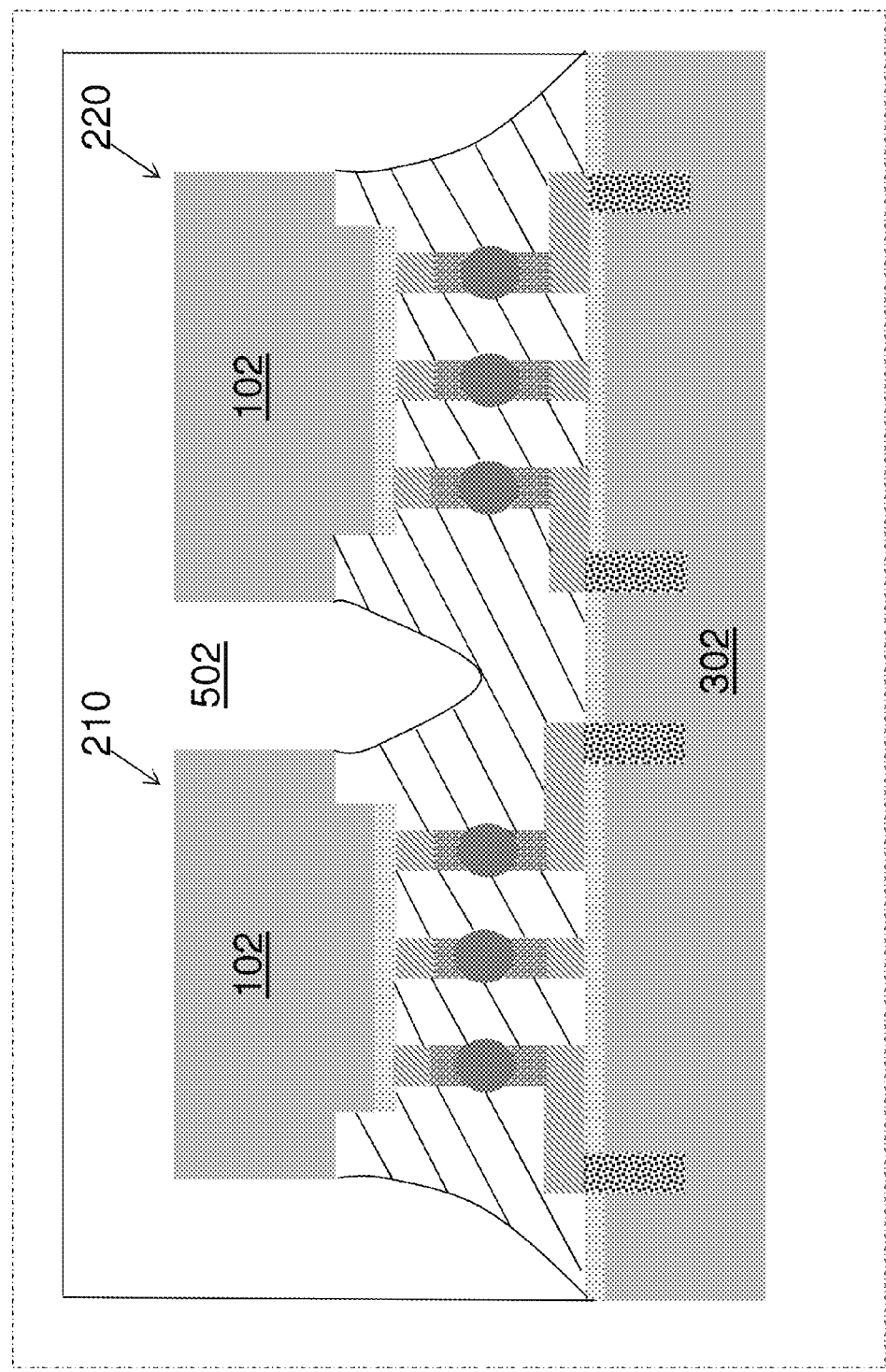
FIG. 5 illustrates a cross sectional view of a 3D IC having a molding compound layer formed on top of the wafer stack.

FIG. 5 illustrates a cross sectional view of a 3D IC having a molding compound layer formed on top of the wafer stack. As shown in FIG. 5, the first semiconductor die 210 and the second semiconductor die 220 are embedded in a molding compound layer 502. The molding compound layer 502 may be formed of curable materials such as polymer based materials, resin based materials, polyimide, epoxy and any combinations of thereof. The molding compound layer 502 can be formed by a spin-on coating process, an injection molding process and/or the like. In order to reliably handle the supporting wafer 302 and the semiconductor dies (e.g., the first semiconductor die 210) mounted on top of the supporting wafer 302 during process steps such as a backside grinding process of the wafer stack, the molding compound layer 502 is employed to keep the supporting wafer 302 and the semiconductor dies on top of the supporting wafer from cracking, bending, warping and/or the like.

Figure 6:
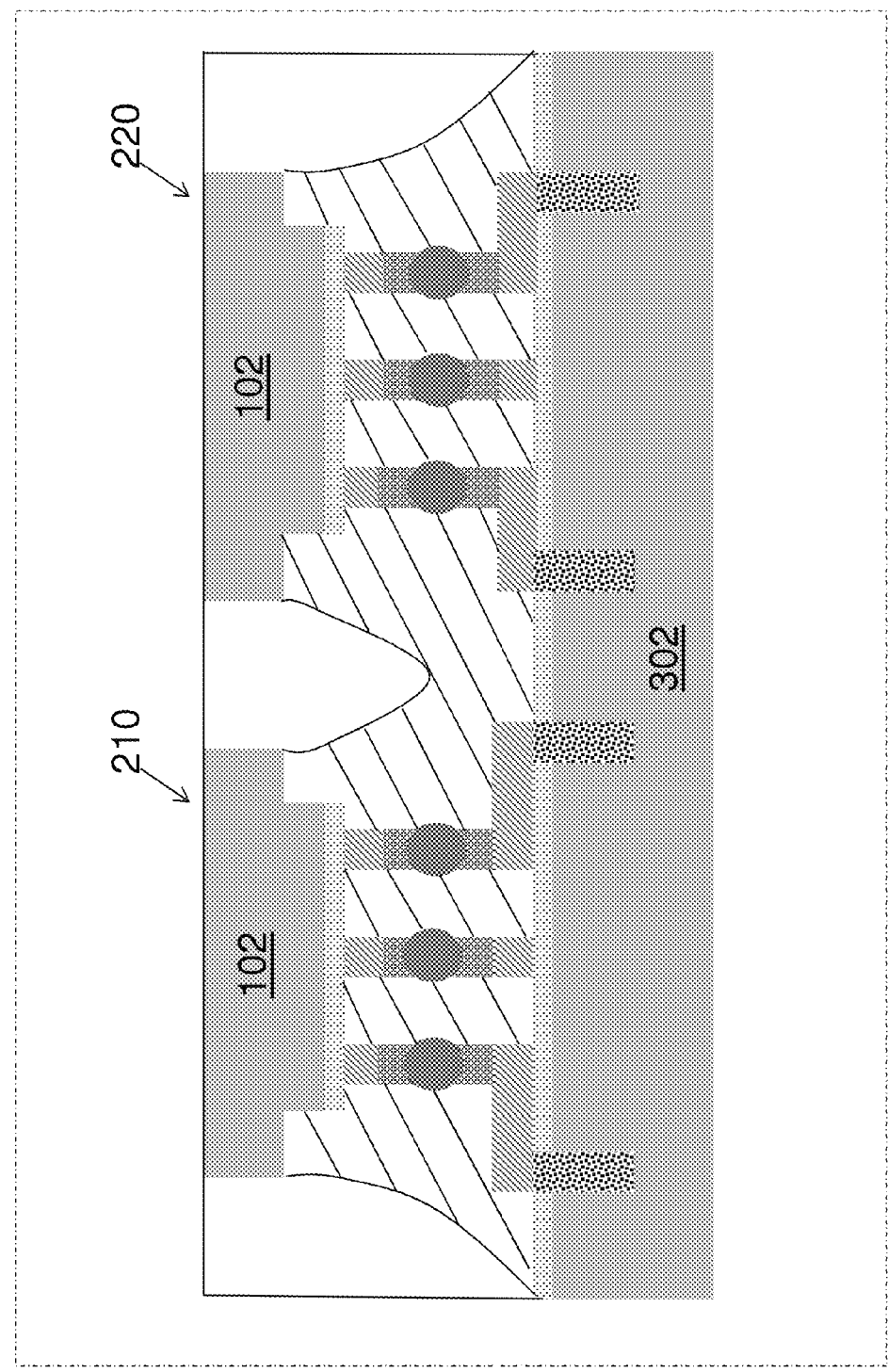
FIG. 6 illustrates a process of backside grinding of a wafer stack in accordance with an embodiment.

FIG. 6 illustrates a process of backside grinding of a wafer stack in accordance with an embodiment. The backside of the semiconductor dies 210 and 220 undergo a thinning process. The thinning process can employ a mechanical grinding process, a chemical polishing process, an etching process or the like. By employing the thinning process, the backside of the semiconductor dies 210 and 220 can be ground so that the semiconductor dies 210 and 220 may have a thickness of approximately sub-100 um. In accordance with an embodiment, the thickness of the semiconductor dies 210 and 220 may be reduced to a range from about 20 um to about 500 um.

Figure 7:
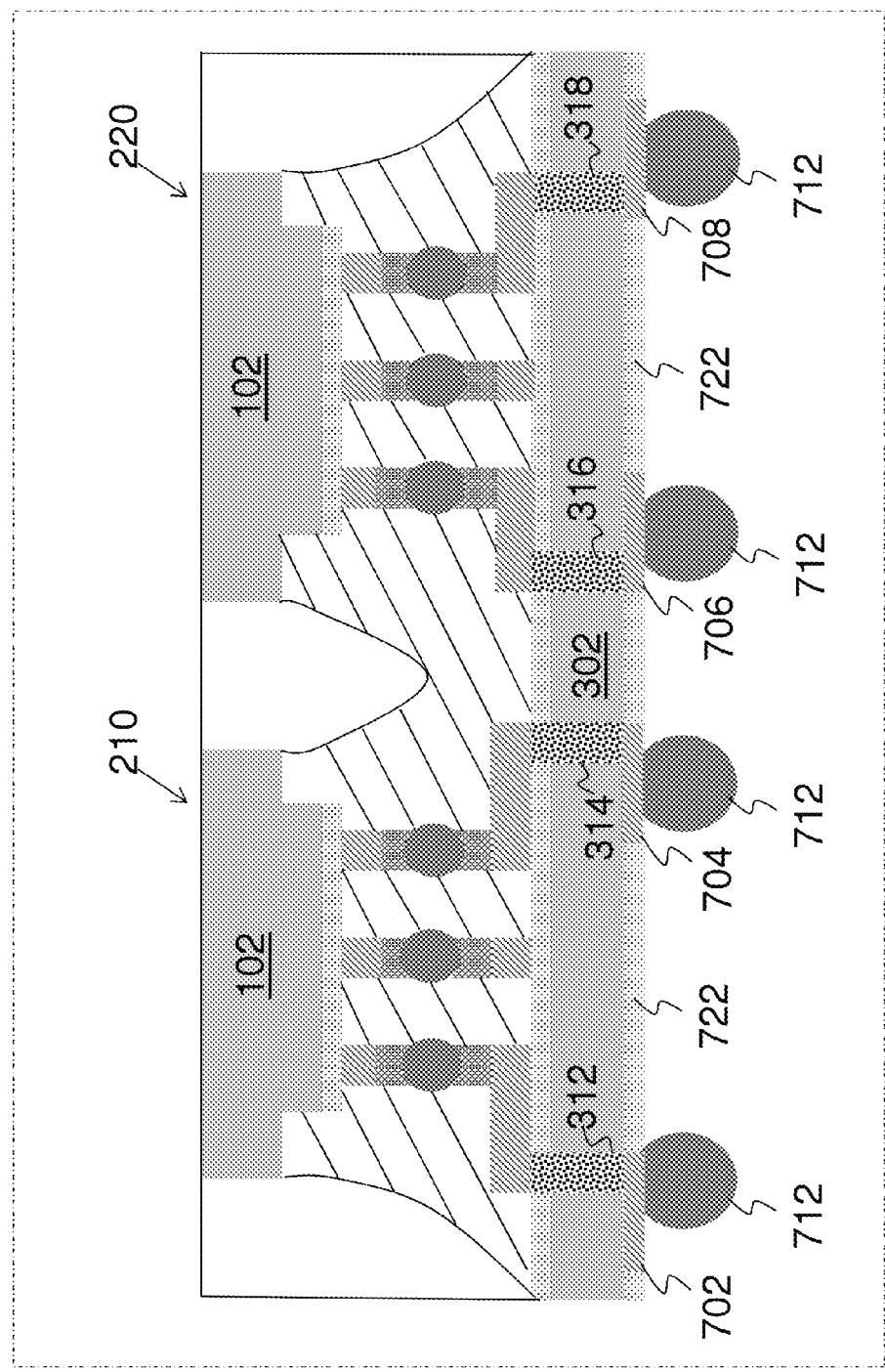
FIG. 7 illustrates a cross sectional view of a 3D IC after a grinding process of a supporting wafer.

FIG. 7 illustrates a cross sectional view of a 3D IC after a grinding process of a supporting wafer. Similar to the backside grinding process of the semiconductor dies, a thinning process is employed to grind the supporting wafer 302 until the embedded ends of the vias (e.g., via 312) become exposed. Subsequently, an isolation layer 722 as well as redistribution layers 702, 704, 706 and 708 is formed on top of the newly ground backside of the supporting wafer 302.

A plurality of UBM structures (not shown) may be formed on top of the redistribution layers 702, 704, 706 and 708. The UBM structures may help to prevent diffusion between the solder balls and the integrated circuits of the multi-chip semiconductor device, while providing a low resistance electrical connection. A plurality of bumps 712 are formed on top of the UBM structures. Some bumps 712 may be formed on top of the exposed ends of the vias (e.g., via 312). It should be noted the bumps 712 may be formed somewhere other than the exposed ends of the vias and reconnected with the vias (e.g., via 314) through the redistribution layer 704.

Figure 8:
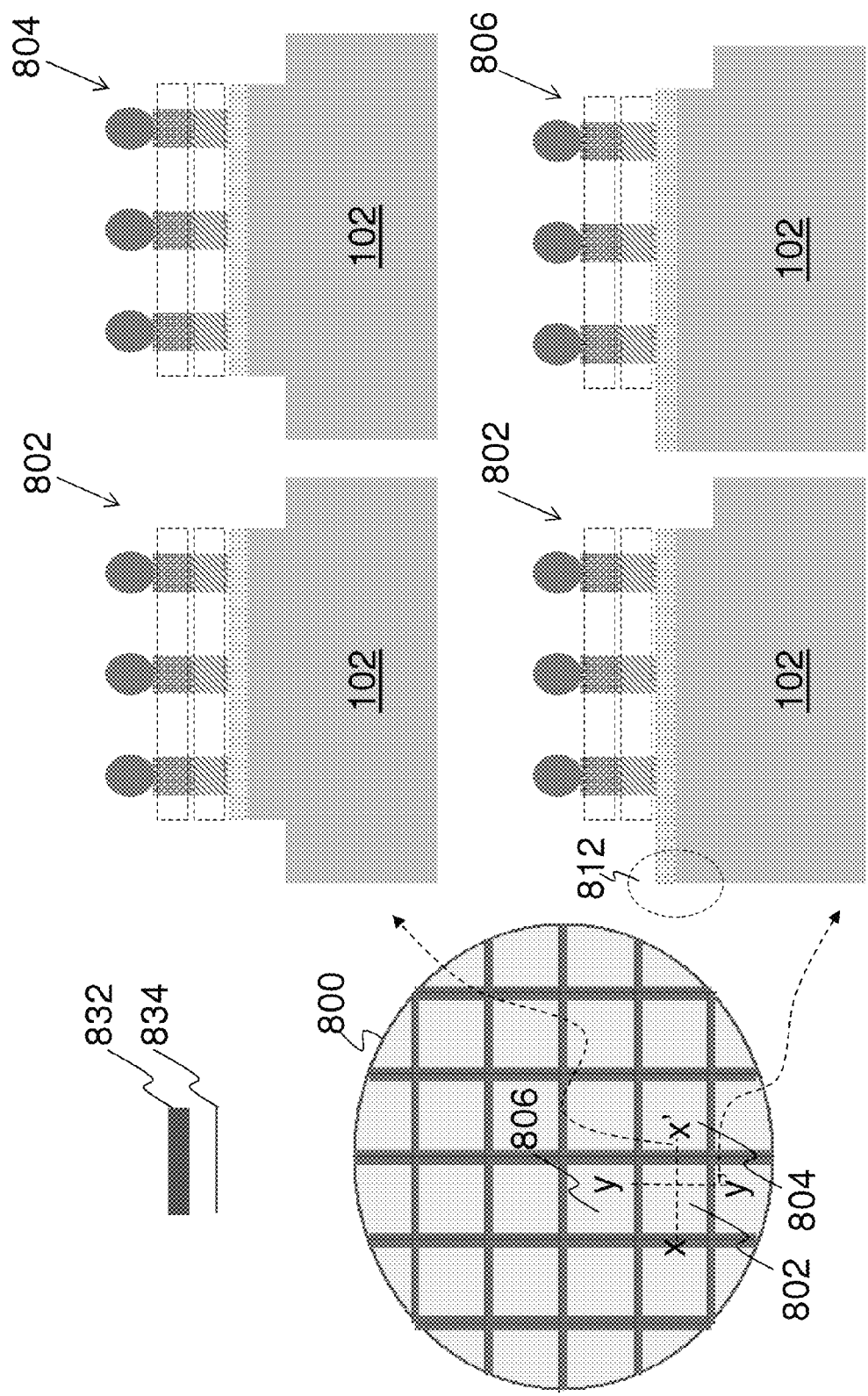
FIG. 8 illustrates cross sectional views of a wafer after a two-step dicing process in accordance with another embodiment.

FIG. 8 illustrates cross sectional views of a wafer after a two-step dicing process in accordance with another embodiment. As shown in FIG. 8, the cross sectional views of a wafer 800 are similar to the cross sectional views of the wafer 100 shown in FIG. 1 except that during the second step of the dicing process, the trenches in the x-x' direction are cut through by a thin blade 834 along one sidewall of the trenches rather than the middle line of trenches. As a result, a semiconductor die may include three step recesses rather than four step recesses shown in FIG. 1. For example, the semiconductor die 802 may include three step recesses. The side of the semiconductor die 802 not having a step recess is indicated by a dashed circle 812. The dicing process of a wafer is well known in the art, and hence is not discussed in detail herein.

Figure 9:
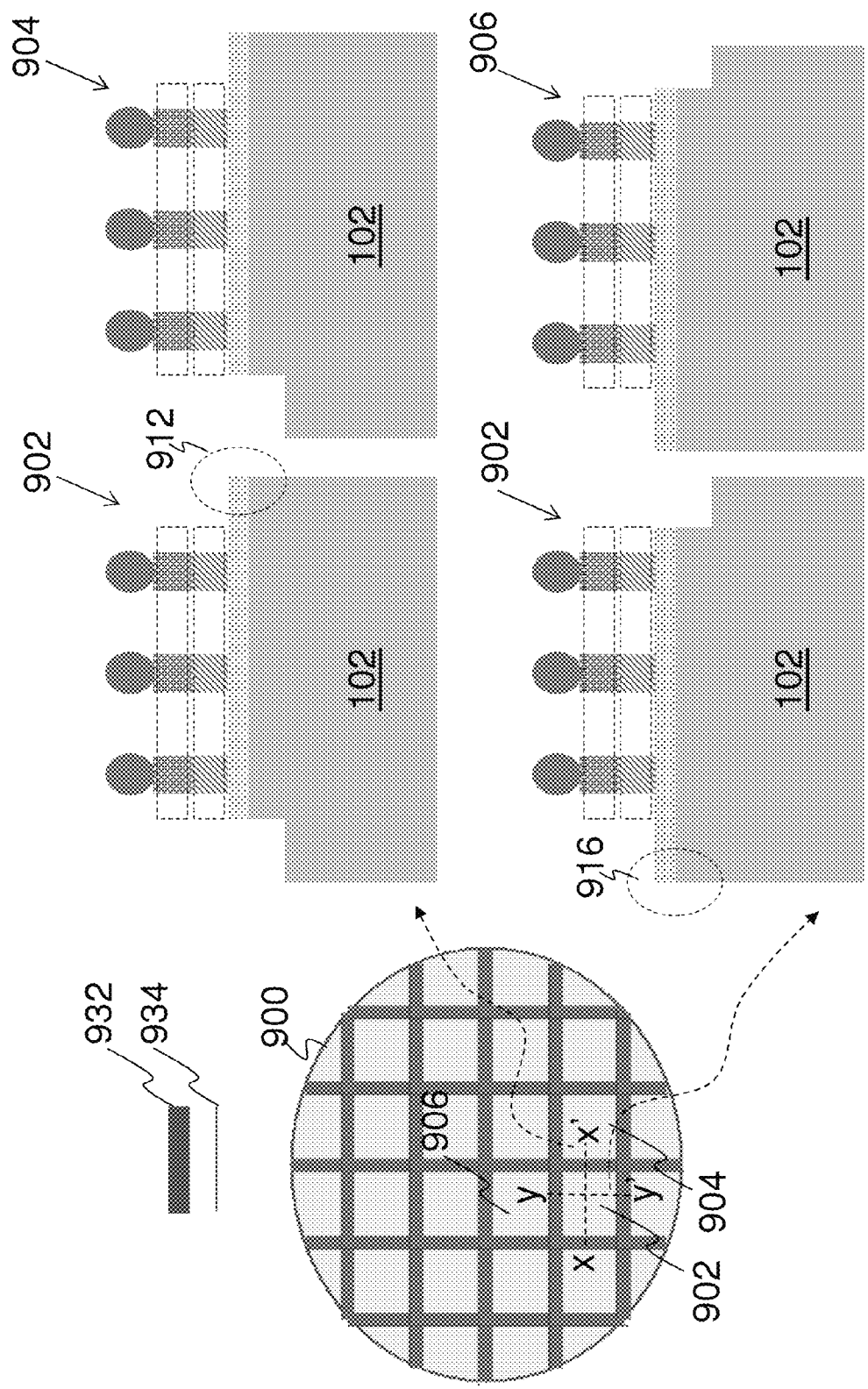
FIG. 9 illustrates cross sectional views of a wafer after a two-step dicing process in accordance with yet another embodiment.

FIG. 9 illustrates cross sectional views of a wafer after a two-step dicing process in accordance with yet another embodiment. As shown in FIG. 9, the cross sectional views of a wafer 900 are similar to the cross sectional views of the wafer 100 shown in FIG. 1 except that during the second step of the dicing process, the trenches are cut through by a thin blade 934 along one sidewall of the trenches rather than the middle line of the trenches. As a result, a semiconductor die may include two step recesses. For example, the semiconductor die 902 may include two step recesses. The sides of the semiconductor die 902 not having a step recess are indicated by dashed circles 912 and 916.

Figure 10:
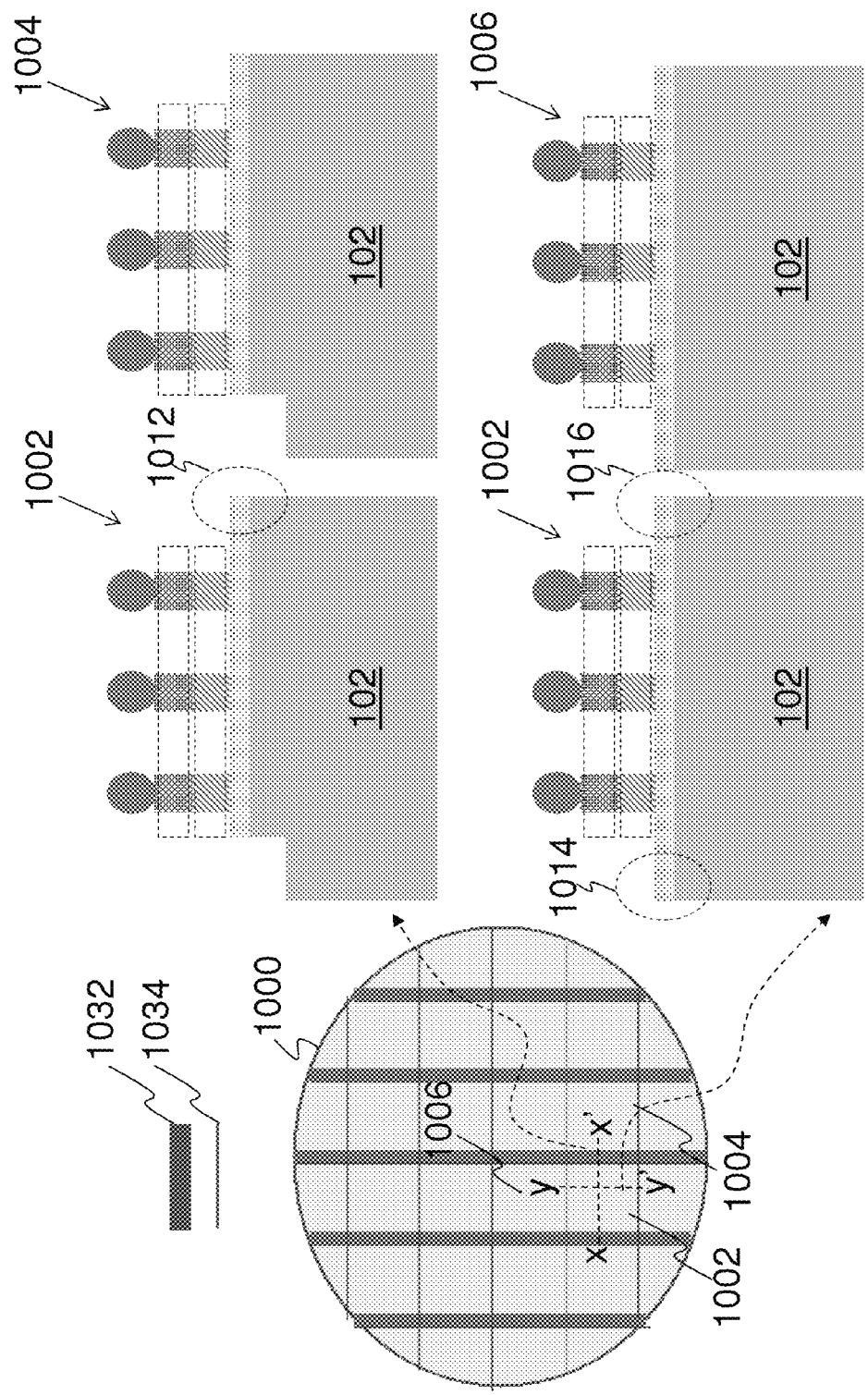
FIG. 10 illustrates cross sectional views of a wafer after a two-step dicing process in accordance with yet another embodiment.

FIG. 10 illustrates cross sectional views of a wafer after a two-step dicing process in accordance with yet another embodiment. As shown in FIG. 10, the cross sectional views of a wafer 1000 are similar to the cross sectional views of the wafer 100 shown in FIG. 1 except that during the first step of the dicing process, the thick blade 1032 is only applied to the trenches along the y-y' direction. Furthermore, during the second step of the dicing process, the trenches in the y-y' direction are cut through by a thin blade 1034 along one sidewall of the trenches rather than the middle line of the trenches. As a result, a semiconductor die may include one step recesses. For example, the semiconductor die 1002 may include one step recess. The sides of the semiconductor die 1002 not having a step recess are indicated by dashed circles 1012, 1014 and 1016.

Figure 11:
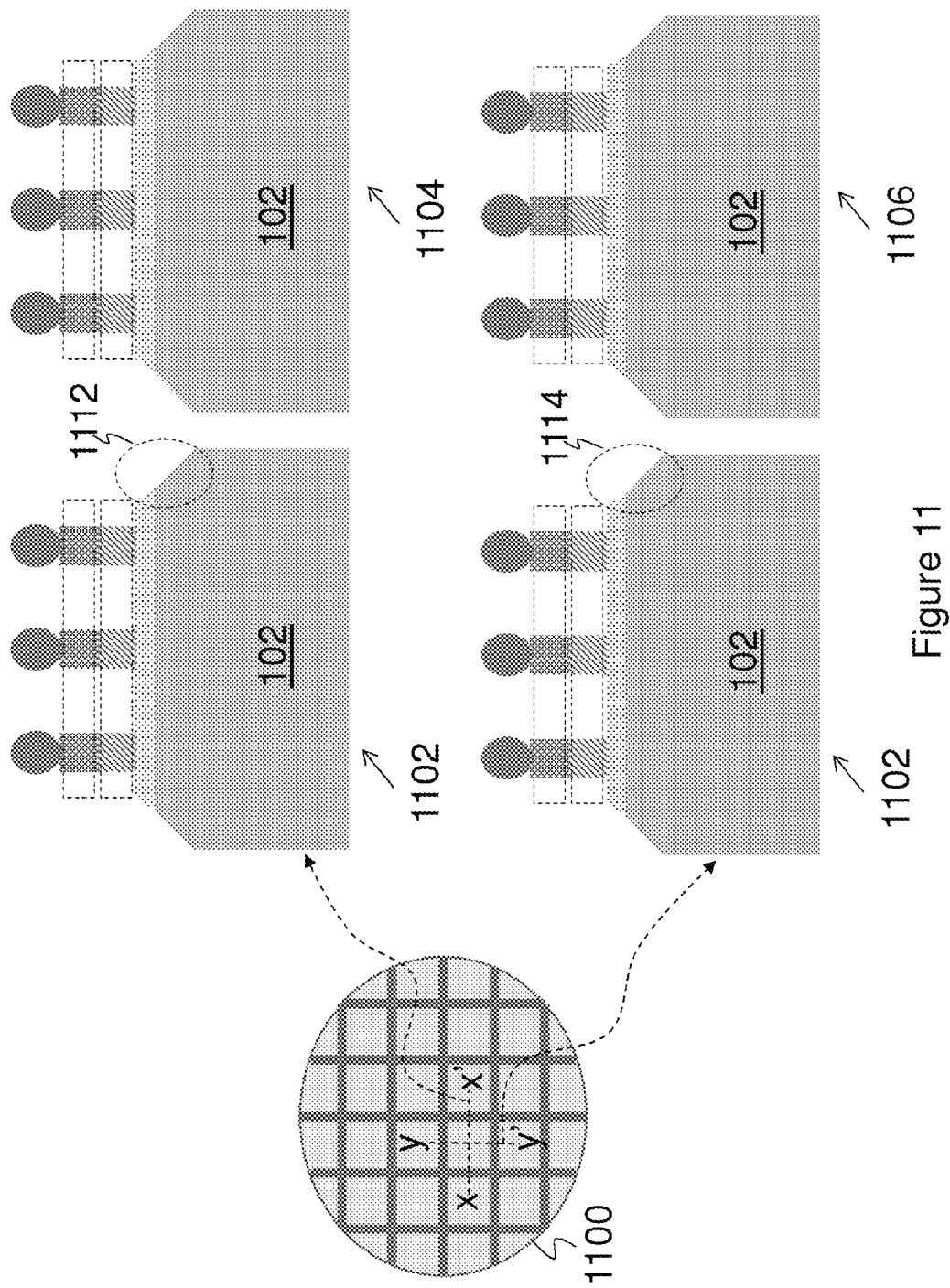
FIG. 11 illustrates cross sectional views of a wafer after a two-step dicing process in accordance with yet another embodiment.

FIG. 11 illustrates cross sectional views of a wafer after a two-step dicing process in accordance with yet another embodiment. As shown in FIG. 11, the cross sectional views of a wafer 1100 are similar to the cross sectional views of the wafer 100 shown in FIG. 1 except that there may be a slope (e.g., slope 1112 and slope 1114) rather than a step recess at each side of the body of the semiconductor 1102. Similarly, FIG. 12 illustrates cross sectional views of a wafer after a two-step dicing process in accordance with yet another embodiment. As shown in FIG. 12, the cross sectional views of a wafer 1200 are similar to the cross sectional views of the wafer 100 shown in FIG. 1 except that there may be a curved shape (e.g., curved shape 1212 and curved shape 1214) rather than a step recess at each side of the body of the semiconductor 1202. It should be noted that in the previous examples, the semiconductor dies after a dicing process may include a step recess, a slope or a curved shape at each side of the body of the semiconductor dies. It is within the scope and spirit of various embodiments for the semiconductor dies to comprise other shapes.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a semiconductor substrate having a recess portion and a non-recess portion, wherein a first recess is located at the recess portion;
   an isolation layer formed on the non-recess portion of the semiconductor substrate;
   a redistribution layer formed on the isolation layer;
   an under bump metal structure formed on the redistribution layer; and
   a first bump formed on the under bump metal structure.

2. The device of claim 1, wherein the first recess is of a step shape at a first side of the device.

3. The device of claim 2, further comprising:
   a second recess having the step shape at a second side of the device; and
   a third recess having the step shape at a third side of the device.

4. The device of claim 2, further comprising:
   a second recess having the step shape at a second side of the device.

5. The device of claim 1, wherein the first recess is of a slope shape.

6. The device of claim 1, wherein the first recess is of a curved shape.

7. A device comprising:
   a first semiconductor die having
     a first semiconductor substrate having a first recess portion, a first top non-recess portion and a first side non-recess portion, wherein a first step recess is located at the first recess portion;
     a first isolation layer formed on the first top non-recess portion of the first semiconductor substrate; and
     a first bump formed on the first isolation layer;
   a second semiconductor die having
     a second semiconductor substrate having a second recess portion, a second top non-recess portion and a second side non-recess portion, wherein a second step recess is located at the second recess portion;
     a second isolation layer formed on the second top non-recess portion of the second semiconductor substrate; and
     a second bump formed on the second isolation layer;
   a package substrate having
     a first side coupled to the first bump of the first semiconductor die and the second bump of the second semiconductor die;
     a second side having a third bump; and
   an underfill layer formed between the first semiconductor die, the second semiconductor die and the package substrate, wherein the first top non-recess portion, the first recess portion, the second top non-recess portion and the second recess portion are embedded in the underfill layer.

8. The device of claim 7, wherein:
   the first semiconductor substrate is coupled to the package substrate using a plurality of first bumps; and
   the second semiconductor substrate is coupled to the package substrate using a plurality of second bumps.

9. The device of claim 7, further comprising:
   a compound layer formed on the package substrate, wherein the first semiconductor die and the second semiconductor die are embedded in the compound layer.

10. The device of claim 7, wherein the package substrate comprises a plurality of vias.

11. The device of claim 7, further comprising:
    an isolation layer formed on the second side of the package substrate; and
    a redistribution layer formed on the isolation layer.

12. The device of claim 11, further comprising:
    an under bump metal structure formed on the redistribution layer; and
    the third bump formed on the under bump metal structure.

13. The device of claim 7, wherein:
    the first step recess has a vertical depth in a range from about 20 um to about 300 um; and
    the second step recess has a vertical depth in a range from about 20 um to about 300 um.

14. The device of claim 7, wherein:
    the first step recess has a horizontal length in a range from about 20 um to about 200 um; and
    the second step recess has a horizontal length in a range from about 20 um to about 200 um.

* * * * *